United States Patent

Krug et al.

Patent Number: 5,216,742
Date of Patent: Jun. 1, 1993

[54] LINEAR THERMAL EVAPORATOR FOR VACUUM VAPOR DEPOSITING APPARATUS

[75] Inventors: Thomas Krug, Hanau am Main; Friedrich Anderle, Hanau-1; Albert Feuerstein, Bruchköbel; Eggo Sichmann, Gelnhausen; Wolfgang Buschbeck, Hanau am Main, all of Fed. Rep. of Germany

[73] Assignee: Leybold Aktiengesellschaft, Hanau I, Fed. Rep. of Germany

[21] Appl. No.: 928,970

[22] Filed: Aug. 11, 1992

[30] Foreign Application Priority Data

Feb. 19, 1992 [DE] Fed. Rep. of Germany ....... 4204938

[51] Int. Cl.$^5$ .............................................. C23C 16/00
[52] U.S. Cl. ............................ 392/389; 118/726; 118/724
[58] Field of Search ................. 118/724, 726; 392/388, 392/389; 373/118

[56] References Cited

U.S. PATENT DOCUMENTS

| | | | |
|---|---|---|---|
| 2,440,135 | 4/1948 | Alexander | 118/726 X |
| 3,984,585 | 10/1976 | Onozaki et al. | 427/76 X |
| 4,979,468 | 12/1990 | Kleyer | 118/726 |

FOREIGN PATENT DOCUMENTS

| | | | |
|---|---|---|---|
| 0050237 | 5/1976 | Japan | 392/389 |
| 0038379 | 3/1984 | Japan | 118/726 |
| 0177370 | 10/1984 | Japan | 118/726 |
| 61-006270 | 1/1986 | Japan | 118/726 |
| 62-086155 | 4/1987 | Japan | 118/726 |
| 2-225659 | 9/1990 | Japan | |

OTHER PUBLICATIONS

*IBM Technical Disclosure Bulletin*, vol. 14, No. 9, Feb. 1972, p. 2548, "Evaporation Apparatus".
*IBM Technical Disclosure Bulletin*, vol. 4, No. 4, Sep. 1961, p. 4, "Evaporation Method and Apparatus".

*Primary Examiner*—Brian E. Hearn
*Assistant Examiner*—Jonathan D. Baskin
*Attorney, Agent, or Firm*—Felfe & Lynch

[57] ABSTRACT

A crucible (9) of a nonmetallic material with an elongated cavity (42) to contain the material to be evaporated has on top a vapor emission slot (45) which is defined at its longitudinal edges (43, 44) by two elongated plates (40, 41) of a likewise nonmetallic material. In the cavity (42) two heating rods (46, 47) are disposed in a mirror-symmetrical relationship to a plane of symmetry (S) through the vapor emission slot (45), one under each of the plates (40, 41) defining the vapor emission slot (45). Additional heating means are provided outside of the crucible and inside of a thermal barrier system.

4 Claims, 1 Drawing Sheet

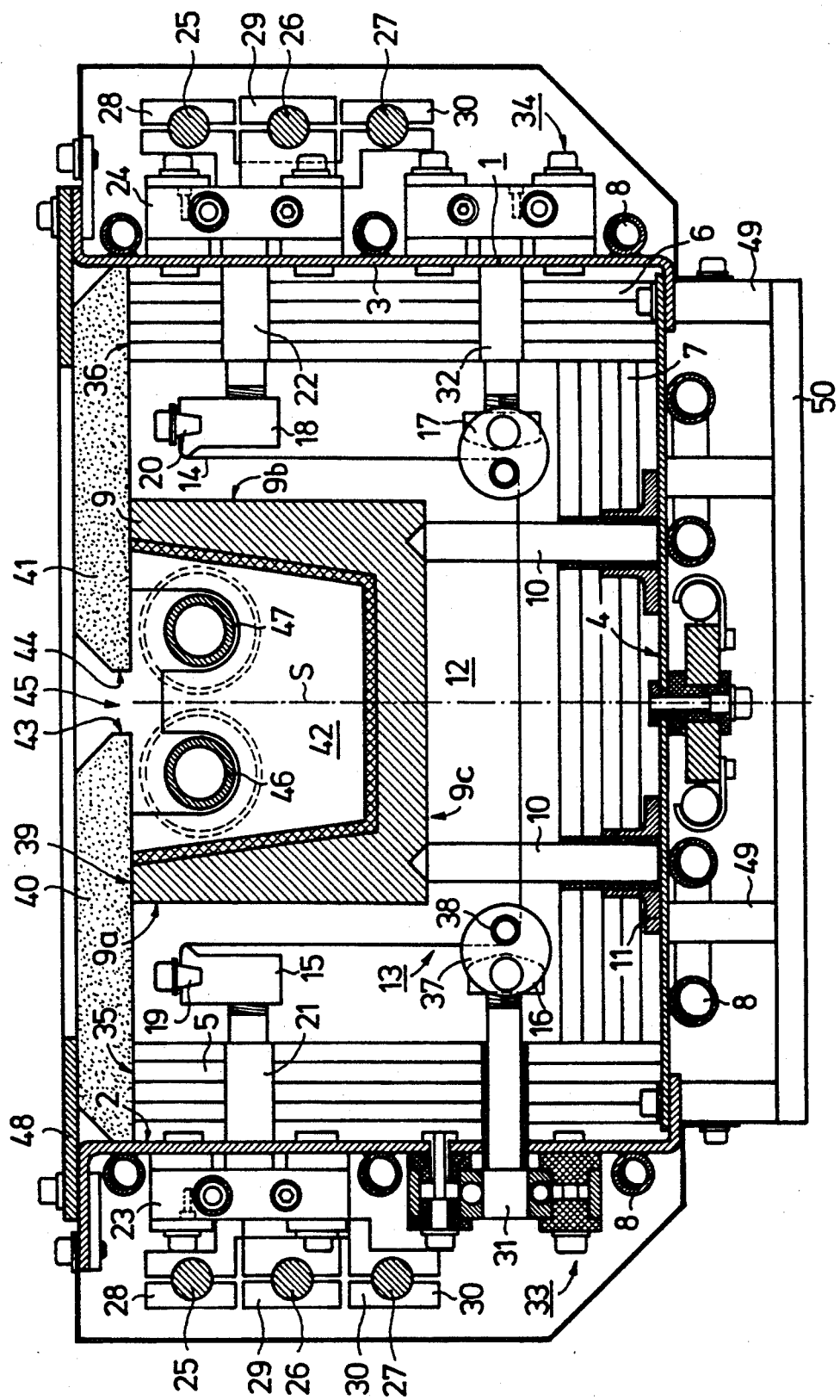

LINEAR THERMAL EVAPORATOR FOR VACUUM VAPOR DEPOSITING APPARATUS

BACKGROUND OF THE INVENTION

The invention relates to a linear thermal evaporator for vacuum vapor depositing apparatus, especially for continuous web coating apparatus, having an elongated crucible of a heat-resistant, nonmetallic material to contain the material to be evaporated. The crucible has an elongated cavity and, on its upper side, a slot for the emission of the vapor, which is defined on its longitudinal edges by two plates of a likewise heat-resistant, nonmetallic material. The crucible has in its cavity a heating rod parallel to the slot, which is of the same length as the slot and is disposed beneath the slot. The crucible is set within a thermal barrier system.

An evaporator of this kind is disclosed by U.S. Pat. No. 2,440,135. In this case, however, only a single heating rod is disposed beneath the center of the vapor emission slot, and not only has to supply the heat for evaporation, but also to compensate most of the heat losses, which at high evaporation temperatures are unavoidable in spite of the thermal barrier system. Consequently, the heating rod must be heated for the production of a sufficiently high temperature, which is considerably greater than the evaporating temperature needed, so that a great temperature gradient occurs between the heating rod and the exterior of the evaporator crucible. This is not helped by the fact that each of the plates defining the vapor emission slot has its own resistance heater whose only purpose is to prevent the vapor from condensing at the mouth of the evaporator.

In the operation of such an evaporator for the purpose of the thermal evaporation of high-melting glasses and/or ceramic substances such as silicon monoxide and silicon dioxide, it has been observed that at least a portion of these substances gives up oxygen to the vacuum produced by the process conditions, and the oxygen reacts with the materials of the crucible or of the crucible lining and of the plates forming the vapor emission slot. Pieces or moldings of graphite are used as a rule as the heat-resistant, nonmetallic materials for the stated purpose, and it has been found that this graphite reacts with the oxygen to form carbon monoxide. Aside from the fact that some of the oxygen is undesirably removed from the material being evaporated, so that under-stoichiometric compounds are formed, and aside from the fact that this oxidation of the materials leads to premature failure of the evaporator, the equilibrium between the internal pressure in the vacuum chamber and the pumping power of the vacuum pumps is considerably upset, so that a rise in pressure undesirably occurs in the vacuum chamber. If it were desired to counter this effect with the power of the vacuum pumps, a considerably greater amount of power would be required, and therefore greater cost of operation of the vacuum depositing apparatus. Furthermore, the heater situated centrally beneath the vapor emission slot, which is therefore necessarily in line of sight with the substrate, has the unpleasant effect of greatly raising the temperature of the substrate. Consequently, not only is additional thermal energy lost to the vapor depositing process, but also the substrate has to be vigorously cooled, especially when delicate materials are involved, such as thermoplastic films. For great radiation intensities and great film thicknesses, such cooling, however, is mostly ineffectual, because such film materials are very poor thermal conductors, as a rule.

SUMMARY OF THE INVENTION

The invention, therefore, is addressed to the problem of improving a linear evaporator of the kind described in the beginning, so that substantially lower thermal gradients will form within the entire evaporator unit, so that especially the heating rod will need to be heated to a substantially lower temperature (relative to the evaporation temperature), and lastly so that the substrate will be exposed to much less thermal stress.

The solution of the stated problem is accomplished in accordance with the invention, in the thermal evaporator described in the beginning, by the fact that
a) two heating rods are provided in mirror-image symmetry about a plane passing vertically through the vapor emission slot, each heating rod being disposed under one of the plates defining the vapor emission slot, and
b) the crucible has an additional heating means on its exterior and inside of the thermal barrier.

Feature a) places the heating rods very much closer to the plates defining the vapor emission slot, so that they do not have to have their own built-in heaters; nevertheless, no vapor condenses on the edges of the plates. The replacement of the heating rods in the cavity of the evaporator is much easier to perform than removing heating rods from the plates defining the slot in the state of the art. Also, by arranging the heating rods underneath the plates the substrate is shielded from the radiant heat, so that less heating power is wasted, the substrate is subjected to far less thermal stress, and consequently it requires less cooling.

Feature b) greatly reduces the radiation of heat from the crucible to the thermal barrier system. If the additional heating means is heated to a correspondingly high temperature level, it is even possible to reverse the heat flow and heat the crucible additionally from the exterior. In this manner the temperature level of the two heating rods disposed underneath the plates can be made substantially lower, so that all that the heating rods basically need to provide is the evaporating or sublimating power (according to the material). Consequently, the reactivity of the heating rod material (also graphite, as a rule) to the oxygen content of the material being evaporated is further reduced, so that the formation of undesired oxides (carbon monoxide) is drastically reduced, and also the consumption, or "burn-out," of the heating rods is reduced to the same degree. Another result is a lower temperature level in the plates defining the vapor emission opening, so that the same positive effects as regards their useful life etc. are observed.

BRIEF DESCRIPTION OF THE DRAWING

The sole figure shows a vertical cross section through a complete evaporator.

DETAILED DESCRIPTION OF THE PREFERRED EMBODIMENT

The drawing represents an oblong metal housing 1 whose lateral walls 2 and 3 and whose bottom 4 are covered with thermal barrier material 5, 6 and 7, which in the present case consists of graphite felt. Cooling coils 8 are disposed on the outside of the metal housing. The metal housing has a plane of symmetry S running in the direction of its greater length, which is perpendicular to the plane of drawing. This plane of symmetry is also the plane of symmetry of a crucible 9 of an oblong exterior shape. The crucible 9 is supported by a plurality of posts 10 on the floor 4 of the metal housing 1. The supports 10 pass through the thermal barrier material 7 of the floor in the manner represented and are held in sockets 11.

Between the crucible 9 and the thermal barrier material 5, 6 and 7 a space 12 of U-shaped cross section is formed, which surrounds the crucible on its three long sides 9a, 9b and 9c. In this U-shaped space is contained a heating means 13 consisting of several resistance elements 14 constituted by heating ribbons. In the present case a total of six of these heating resistances are disposed in the direction of the depth of the system, i.e., in a direction perpendicular to the plane of drawing, only one of them being visible in the drawing. Each of these heating resistances runs from a first terminal 15 over a first post holder 16 and a second post holder 17 to a second terminal 18, and are held in these terminals by wedge-shaped terminal strips 19 and 20. The sections of the heating resistance run parallel to the longitudinal sides 9a, 9b and 9c of the crucible 9.

The two terminals 15 and 18 are attached by studs 21 and 22 to water-cooled clamping bodies 23 and 24, respectively. The clamping bodies 23 and 24 are in turn connected in cyclic sequence to bus bars 25, 26 and 27 of a three-phase alternating current system, through clamps 28, 29 and 30. The post holders 16 and 17 are connected via threaded studs 31 and 32 to additional clamping bodies 33 and 34. All clamping bodies are fastened to the lateral walls 2 and 3 of the metal housing 1 with the interposition of insulating sleeves. It can be seen that the last-mentioned terminal and fastening means are situated outside of the cooled metal housing, so that no undesirable thermal stress occurs.

On the high-temperature side, the studs 31 and 32 have two side plates 37 between which is a post 38 around which the heating resistance 14 is reeved at 90 degrees.

The thermal barrier material 5 and 6 disposed on the lateral walls 2 and 3 has top edges 35 and 36 which are situated in a common horizontal plane. In this common plane lies also the top, continuous circumferential edge 39 of the crucible 9. On these top edges 35, 36 and 39, plates 40 and 41 of a refractory mineral material are placed, such that the outer margin of each of the two plates is supported on the thermal barrier material, a first part of its middle portion covers the U-shaped space 12 containing the heating system 13, a second part of its middle portion rests on the top edge 39 of the crucible, and its inner portion covers the cavity 42 of the crucible 9. Between the parallel inside edges 43 and 44 of the plates 40 and 41 a narrow slot 45 is formed, which serves for the emission of the coating material that is formed by the evaporation of the material situated in the cavity 42. Beneath the inner portion of each of the two plates 40 and 41 are two heating rods 46 and 47, which are invisible when looking vertically down through the slot 45, and which are brought at both ends through the end walls of the crucible 9 in a vapor-tight manner.

This arrangement of the heating rods 46 and 47 avoids any direct influence (by radiation) on the substrate, which must be imagined as running parallel to the upper edge of the crucible. Instead, the bottom of the inside edges or inside areas of the plates 40 and 41 overreaching the cavity 42 are heated very intensely and yield their radiant heat to the material being evaporated, which are to be visualized as being situated in the cavity 42 directly under the heating rods 46 and 47. In addition, any loss of heat through the long sides 9a, 9b and 9c of the crucible is prevented or at least largely suppressed by the fact that the heating resistances 14 are heated to a correspondingly high temperature which determines the direction in which the heat is carried. In order to fix the entire arrangement at the top as well, a clamping frame 48 consisting of sheet metal is situated above the plates 40 and 41 and on the entire periphery of the metal housing 1, and is bolted on its outer periphery to the correspondingly angled margin of the metal housing 1.

In the manner described, a thermal evaporator is formed, whose component parts can easily be removed and replaced by removing the clamping frame 48. Also the studs 21 and 22 as well as the threaded studs 31 and 32 can easily be removed after loosening the screw fastenings (not numbered in the drawing) so that the thermal barrier material 5, 6 and 7 can also be easily removed or replaced. The metal housing 1 is fastened by a plurality of studs 49 on a bottom plate 50 which in turn is affixed to the bottom of a vacuum chamber which is not shown here.

The evaporator according to the invention is suited preferentially for the thermal evaporation of high-melting glasses and/or ceramic materials such as SiO, $SiO_2$, etc. It is especially intended for so-called continuous web vapor depositing apparatus in which a film runs in a direction perpendicular to the slot 45 continuously over the top of the evaporator and parallel to the top of the latter. With the evaporator crucible it is possible to set the temperatures of the individual components which come in contact with the material being evaporated, and with the vapor, to such a temperature level that there will be no condensation on the components in question. Due to the geometrical arrangement of the heating rods 46 and 47 in relation to the slot 45, any possibility that material will be splashed out is largely prevented. The result is an extraordinarily uniform coating thickness on the substrate.

We claim:

1. Linear thermal evaporator comprising
   an elongate crucible of a heat-resistant, nonmetallic material for holding a material to be evaporated, said crucible having an elongate cavity covered by two plates of a heat-resistant nonmetallic material, said plates each having an edge, said edges being spaced to define a slot therebetween over said cavity,
   two heating rods in said cavity in mirror image symmetrical relationship to a vertical plane of symmetry through said slot, one rod lying under each plate,
   a thermal barrier outside of said crucible and spaced therefrom, and
   additional heating means between the crucible and the thermal barrier.

2. Evaporator as in claim 1 further comprising an elongate metal housing having lateral walls and a bottom defining an inside surface, said thermal barrier comprising a thermal barrier material covering said inside surface, said additional heating means comprising at least one U-shaped resistive heating element between said crucible and said thermal barrier.

3. Evaporator as in claim 2 wherein the thermal barrier and the crucible have top edges which lie in a common horizontal plane, each plate having an inner portion over the cavity in said crucible, a middle portion on the edge of the crucible and thermal barrier, and an outer portion extending between the middle portion and the container.

4. Evaporator as in claim 2 further comprising frame means for fixing said plates to said container.

* * * * *